United States Patent [19]

Banerjee et al.

[11] Patent Number: 4,700,370
[45] Date of Patent: Oct. 13, 1987

[54] HIGH SPEED, LOW POWER, MULTI-BIT, SINGLE EDGE-TRIGGERED, WRAPAROUND, BINARY COUNTER

[75] Inventors: Pradip Banerjee, Sunnyvale; Paul D. Keswick, San Jose, both of Calif.

[73] Assignee: Advanced Micro Devices, Inc., Sunnyvale, Calif.

[21] Appl. No.: 782,655

[22] Filed: Sep. 30, 1985

[51] Int. Cl.$^4$ .................. H03K 23/44; H03K 21/02
[52] U.S. Cl. .................................... 377/55; 377/41;
377/107; 377/111; 377/117; 377/121; 377/105
[58] Field of Search ............... 377/41, 55, 105, 107, 377/111, 117, 121

[56] References Cited

U.S. PATENT DOCUMENTS

| | | | |
|---|---|---|---|
| 3,745,372 | 7/1973 | Koster | 377/105 |
| 3,766,408 | 10/1973 | Suzuki et al. | 377/105 |
| 3,943,378 | 3/1976 | Beutler | 377/117 |
| 4,182,961 | 1/1980 | Dingwall | 377/117 |
| 4,218,750 | 8/1980 | Carter et al. | 377/111 |
| 4,512,030 | 4/1985 | Fukuta | 377/107 |

Primary Examiner—John S. Heyman
Attorney, Agent, or Firm—Patrick T. King; Davis Chin

[57] ABSTRACT

A high speed, low power, multi-bit, single edge triggered, wraparound binary counter is provided which is resettable and loadable from a user-supplied address. The binary counter requires a relatively small amount of power due to the use of CMOS technology for construction of its circuitry, may be initiated at any of $2^N$ (where N=bit count) start locations, and can be easily adapted to accommodate any desired number of counter cells. Further, it is capable of operating over wide ranges of temperatures and power supply conditions. The high speed binary counter is formed of a plurality of counter cells in which each counter cell includes a pass gate device responsive to a counter-update signal for allowing true and complement addresses to control a switching device when the counter-update signal is in the low state and for isolating the true and complement addresses from the switching device when the counter-update signal is in the high state. Counter-update gating devices are interconnected between a counter pulse signal and each of the counter cells so as to determine which of the counter cells are to receive the counter-update signal so as to change the state of the true and complement addresses.

18 Claims, 14 Drawing Figures

HIGH SPEED, LOW POWER, MULTI-BIT, SINGLE EDGE-TRIGGERED, WRAPAROUND, BINARY COUNTER

BACKGROUND OF THE INVENTION

This invention relates generally to binary counters and more particularly, it relates to a high speed, low power loadable, single edge-triggered, wraparound, binary counter.

As is well known, counters are useful in a variety of logic or control systems such as special or general-purpose digital computers, electronic calculators, digital electronic switching systems or digital electronic control systems. With the advent of large scale integration (LSI) technology, such counters may be formed together with other analog and digital circuitry on a single silicon chip of an integrated circuit device. As a result, there has arisen the need to construct a counter which is capable of high speed operation and has low power dissipation. It would also be desirable to provide a fully bit-sliced binary counter in which the number of counter cells may be increased to any desired bit-count in a simple manner so as to facilitate design, layout and manufacturing, thereby reducing cost and enhancing reliability.

SUMMARY OF THE INVENTION

Accordingly, it is a general object of the present invention to provide a high speed, low power loadable wraparound binary counter which is relatively simple and economical to manufacture.

It is an object of the present invention to provide a high speed binary counter which is resettable and loadable from a user-supplied address bus for easy initiation.

It is another object of the present invention to provide a high speed binary counter which can have a start location at any of $2^N$ states (where N=bit count).

It is still another object of the present invention to provide a fully bit-sliced counter in which the number of counter cells may be easily increased so as to accommodate any number of bits.

It is yet still another object of the present invention to provide a high speed binary counter which is capable of operating over wide power supply and temperature ranges.

It is yet still another object of the present invention to provide a high speed binary counter which is responsive only to a single edge of the user-supplied control signal.

In accordance with these aims and objectives, the present invention is concerned with the provision of a high speed binary counter which includes a plurality of counters cells. Each counter cell includes a first logic device for storing a binary number and for generating a true address corresponding to the stored binary number and a second logic device for storing the complement of the binary number and for generating a complement address corresponding to the inverse of the stored binary number. A multiplexor is responsive to a user-supplied loading signal for loading the binary number into the first and second logic devices. Pass gate devices are responsive to the true and complement addresses for allowing the true and complement addresses to control a switching device when a counter-update signal is in the low state and for isolating the true and complement addresses from the switching device when the counter-update signal is in the high state. The switching device is responsive to a latch device which contains the previous address information for directing the counter-update signal to either the first logic device or the second logic device so as to change the state of the true and complement addresses. The latch device is responsive to the pass gate devices for maintaining the switch in the same condition when the true and complement addresses are isolated from the switch device. A first pull-down device is connected to an input of the first logic device for maintaining its input in the low state when the counter-update signal is directed to the second logic device. A second pull-down device is connected to an input of the second logic device for maintaining its input in the low state when the counter-update signal is directed to the first logic device.

In another aspect of the present invention, there is provided a counter-update gating device which consists of a P-channel MOS transistor and a N-channel MOS transistor having there respective drains and sources connected together. An input counter signal is connected to the common sources of the P-channel and N-channel transistors. The gate of the P-channel transistor is connected to a complement counter-carry signal, and the gate of the N-channel transistor is connected to a true counter-carry signal for enabling of the gating device when the complement counter carry signal is in a low state. A counter-update signal, which is responsive to the user-supplied clock edge, is generated at the common drains of the transistors only when the gating device is enabled. A carry logic device is responsive to all lower order counter cell addresses and generates the complement counter carry signal which is in the low state when all of the lower order true addresses are in a high state.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
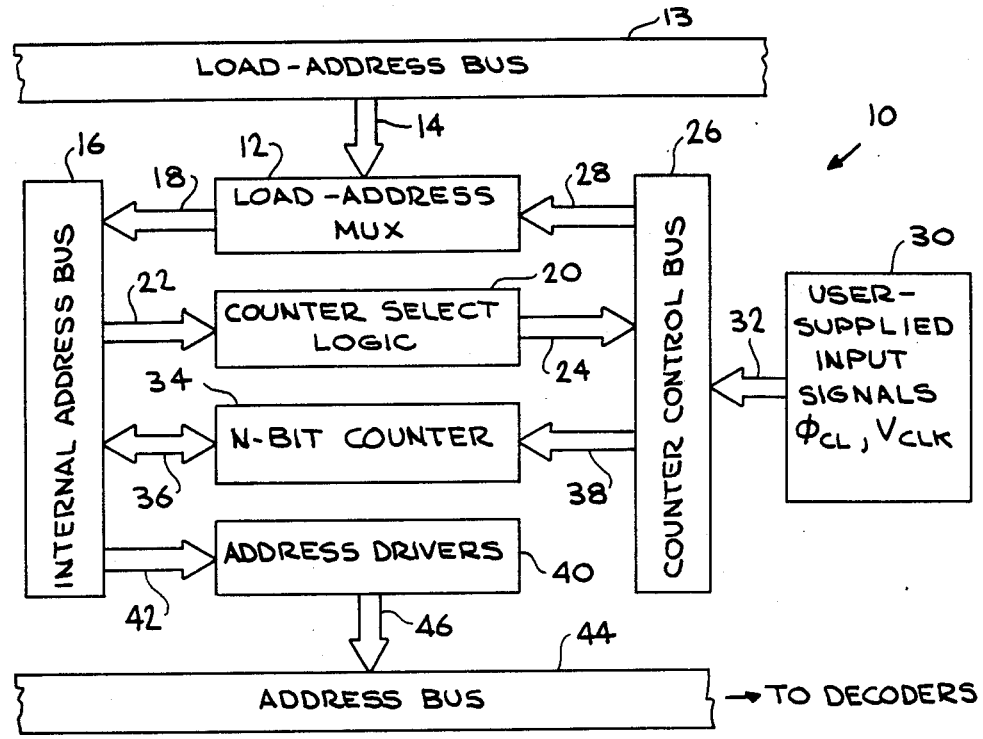
FIG. 1 is a block diagram of a high speed binary counter of the present invention.

Referring now in detail to the various drawings, there is shown in FIG. 1 a block diagram of a high speed, low power, loadable, wraparound, binary counter 10 of the present invention. The binary counter 10 includes a load-address bus 13 which delivers a user-supplied start address to a load-address multiplexor 12 via lines 14. The load-address multiplexor 12 is used for multiplexing of the load-address bus 13 carrying the user-supplied start address with an internal address bus 16 via lines 18. A counter select logic block 20 is connected to the internal address bus 16 via lines 22 and controls the load-address multiplexor 12 via lines 24, a counter control bus 26, and lines 28. The counter control bus 26 is used to carry control signals and is responsive to user-supplied input signals 30 via lines 32. A N-bit counter block 34 is formed of N individual one-bit counter cells and is interconnected via lines 36 with the internal address bus 16 for receiving the start address from the load-address bus 13. The counter block 34 also receives incrementing signals via lines 38 from the counter control bus 26 as controlled by the user-supplied input signals 30 and the counter select logic block 20. Address drivers 40 are connected via lines 42 to the internal address bus 16 for transferring the counter-generated addresses from the counter block 34 to decoder address bus 44 via lines 46. The address drivers provide high current drive for the decoders which are connected to the decoder address bus 44. The decoder address bus 44 is used to deliver the counter-generated address to the decoders.

The user-supplied input signals 30 allow for the initialization of the counter block 34 at any one of 2 stages as a starting point (where N=bit count). This is achieved by loading the start address from the load-address bus 13 under the direction of a loading signal $\phi_{CL}$ from the block 30 and the counter control bus 26. After completion of the loading operation, control signals from the counter control bus 26 are used to disconnect the load-address bus 13 from the internal address bus 16 via multiplexor 14 so that it will not effect the later operation of a counter block 34, as well as, allowing the load-address bus 13 to be utilized for various other operations.

Figure 2:
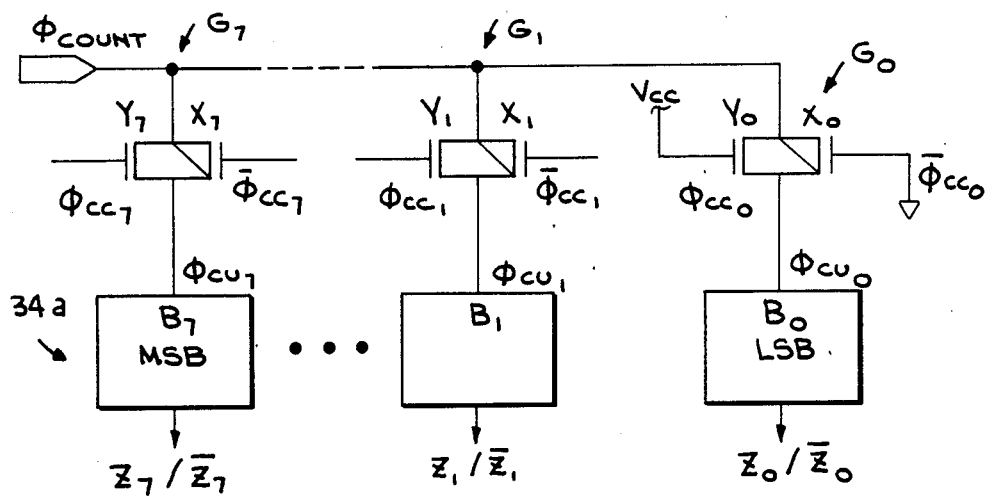
FIG. 2 is a block diagram illustrating an 8-bit binary counter, in accordance with a preferred embodiment of the present invention.

While the N-bit counter 34 may be formed of any number of bit-slices or counter cells, there is shown in FIG. 2 an 8-bit counter 34a containing bits $B_0$, $B_1$, ... $B_7$. For purposes of convenience of this discussion, references hereinafter will be made relative to an 8-bit counter illustrative of a preferred embodiment of the present invention. Each of the bits $B_0$, $B_1$, ... $B_7$ define one of the counter cells of the binary counter 34a. The least significant bit (LSB) is counter cell $B_0$ and the most significant bit (MSB) is $B_7$. The true and complement output states of the counter cells $B_0$, $B_1$, ... $B_7$ are $Z_0/\overline{Z}_0$, $Z_1/\overline{Z}_1$, ... $Z_7/\overline{Z}_7$ respectively. The counter 34a is controlled by a pulse signal $\phi_{COUNT}$ which is used to increment the appropriate counter cells so that it may count as an up-counter in a binary fashion. It should be apparent to those skilled in the art that the counter 34a may be made to count as a down-counter with minimum logic modifications. Since only some of the counter cells are to be flipped or changed in state from "1" or "0" (or vice versa), pass gates $G_0$, $G_1$, ... $G_7$ are interconnected between $\phi_{COUNT}$ and each of the respective counter cells $B_0$, $B_1$, ... $B_7$ for controlling which of the counter cells are to receive the phase count pulse signal during each cycle thereof.

Each pass gate is formed of a P-channel MOS transistor ($X_0$ thru $X_7$) and a N-channel MOS transistor ($Y_0$ thru $Y_7$) whose sources are connected together and receive the signal $\phi_{COUNT}$. The drains of the respective P-channel and N-channel transistors are also connected together for generating an output defined as counter-update signal $\phi_{CUi}$ (i=0, 1, ... 7). True counter-carry signals ($\phi_{CC0}$, $\phi_{CC1}$, ... $\phi_{CC7}$) are applied to the respective gates of the N-channel transistors $Y_0$ thru $Y_7$. Complement counter carry signals ($\overline{\phi}_{CC0}$, $\overline{\phi}_{CC1}$, ... $\overline{\phi}_{CC7}$) are applied to the respective gates of the P-channel transistors $X_0$ thru $X_7$. Thus, the $\phi_{COUNT}$ signal is allowed to go through the pass gates $G_0$, $G_1$, ... $G_7$ when the respective $\overline{\phi}_{CC0}$, $\overline{\phi}_{CC1}$, ... $\overline{\phi}_{CC7}$ are low and $\phi_{CC0}$, $\phi_{CC1}$, ... $\phi_{CC7}$ are high. In other words, the counter carry signals control which of the counter-update signals $\phi_{CUi}$ will receive the $\phi_{COUNT}$ signal, thereby causing the appropriate counter cells ($B_0$, $B_1$, ... $B_7$) to be updated and hence changing their respective output states.

When counting up in binary fashion, it will be noted that the LSB bit $B_0$ will always be flipped for each cycle of the $\phi_{COUNT}$ signal. Thus, the gate of the N-channel transistor $Y_0$ receiving the $\overline{\phi}_{CC0}$ can be tied to a positive supply potential VCC, and the gate of the P-channel transistor $X_0$ receiving the $\phi_{CC0}$ can be tied to a ground potential. Accordingly, the pass gate $G_0$ will always be turned on so that $\phi_{COUNT}$ reaches the counter cell $B_0$ in every cycle. The remaining counter cells $B_1$ thru $B_7$ are only flipped when all of the counter cells outputs preceeding it (lower in order) are in the high or "1" state. For example, assuming the counter 34a has outputs 10001111 (LSB is on the right) then only the five lowest order bits are flipped when the next $\phi_{COUNT}$ pulse is received. Thus, it can be seen that $\phi_{CC1}/\overline{\phi}_{CC1}$ is a function of the outputs $Z_0/\overline{Z}_0$; $\phi_{CC2}/\overline{\phi}_{CC2}$ is a function of the outputs $Z_0/\overline{Z}_0$ and $Z_1/\overline{Z}_1$; and etc. The circuitry for implementing this logic will be discussed hereinafter. The pass gates $G_0$, $G_1$, ... $G_7$ and the counter carry signals $\phi_{CCi}/\overline{\phi}_{CCi}$ (i=0, 1, ... 7) form the counter select logic block 20 of FIG. 1.

The counter-carry signals $\phi_{CC0}/\overline{\phi}_{CC0}$, ... $\phi_{CC7}/\overline{\phi}_{CC7}$ should be generated fast enough so that they are available before the arrival of the next $\phi_{COUNT}$ pulse. This ensures that the counter cycle speed is not degraded due to the counter-carry logic. However, the $\phi_{CC0}/\overline{\phi}_{CC0}$, ... $\phi_{CC7}/\overline{\phi}_{CC7}$ should be slow enough to come in only after the present cycle of the phase count pulse as gone off. Otherwise the problem of "counter error" will occur where some of the counter cells will be flipped twice during a single cycle of the phase count pulse. Further, the speed limitation for the counter-carry signals must be met under all process parameters and over the entire operating temperature range.

Figure 3:
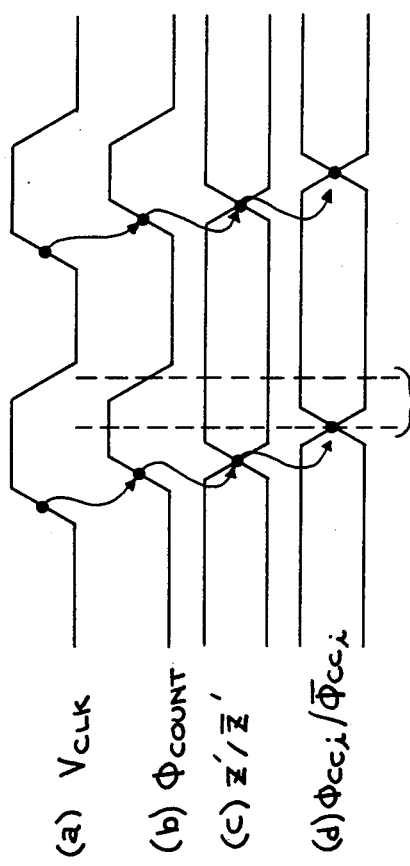
FIGS. 3(a)–3(d) are wave forms useful in understanding the problem of counter error.
Figure 13:
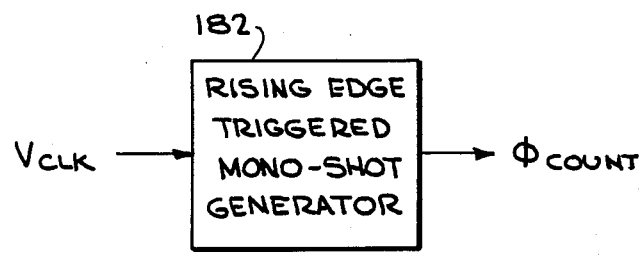
FIG. 13 is a block diagram illustrating the manner for generating the phase count pulses.

The problem of "counter error" can be best illustrated by reference to the wave forms FIGS. 3(a)–3(d). FIG. 3(a) is an user-supplied incrementing input pulse $V_{CLK}$ for initiating an increment in the binary counter. In response to the input pulse $V_{CLK}$, a $\phi_{COUNT}$ pulse is generated as shown in FIG. 3(b). FIG. 13 shows in block diagram form the generation of this $\phi_{COUNT}$ pulse signal. Assuming that the $\phi_{COUNT}$ pulse signal is supplied to an Nth counter cell so as to cause it to be flipped (i.e., the pass gate is open) the outputs $Z'_N/\overline{Z}'_N$ of the Nth counter cell will be flipped as shown in FIG. 3(c). Since $\phi_{CCi}/\overline{\phi}_{CCi}$ shown in FIG. 3(d) is determined by $Z'_N/\overline{Z}'_N$ of all lower order bits, the counter-carry signals $\phi_{CCi}/\overline{\phi}_{CCi}$ may also be flipped. However, this counter carry signal is to be used during the next $\phi_{COUNT}$ pulse. If the present $\phi_{COUNT}$ signal in FIG. 3(b) is still on, the counter cell output $Z'_N/\overline{Z}'_N$ might be flipped again and thus causing a "counter-error". The area A is where there is an overlapping between the $\phi_{COUNT}$ and $\phi_{CCi}/\overline{\phi}_{CCi}$ signals which defines the region of potential "counter error".

Figure 4:
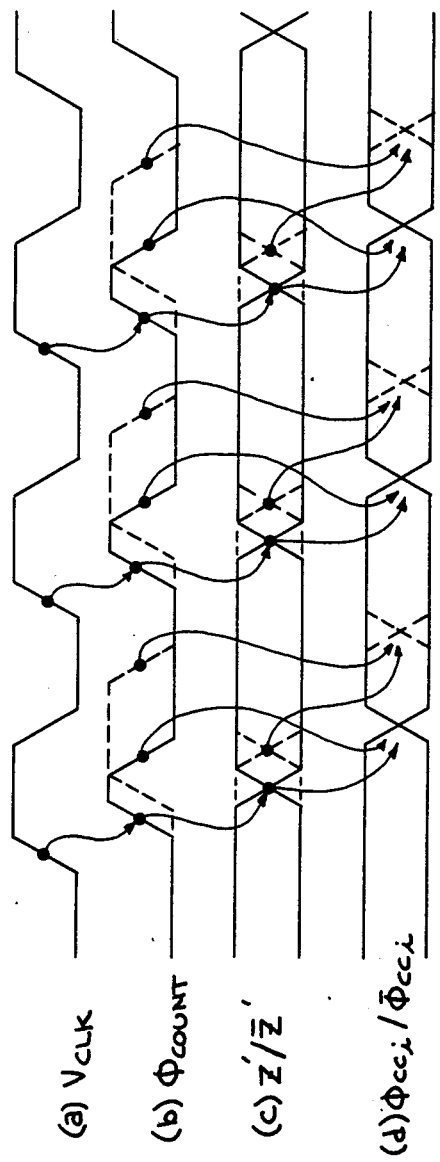
FIGS. 4(a)–4(d) are wave forms useful in understanding of the operation of the block diagram of FIG. 2.

The present invention is concerned with the provision of a built-in control mechanism which allows for the overlap between $\phi_{COUNT}$ and $\phi_{CCi}/\overline{\phi}_{CCi}$ to exist, but yet does not cause "counter error". The solution of the present invention is described with reference to the waveforms illustrated in FIGS. 4(a)–4(d). FIG. 4(a) is again a user-supplied input pulse signal $V_{CLK}$ for initiating an increment in the counter. In response to the input pulse $V_{CLK}$, $\phi_{COUNT}$ pulse signal is generated in FIG. 4(b). The solid line represents a fast counter pulse signal and the dotted line represents a slow counter pulse signal. The outputs $Z'_N/\overline{Z}'_N$ of the counter cell are shown in FIG. 4(c). The counter-carry signals $\phi_{CCi}/\overline{\phi}_{CCi}$ are shown in FIG. 4(d). However, it should be noted that $\phi_{CCi}\overline{\phi}_{CCi}$ are isolated from the pass gate until the $\phi_{COUNT}$ signal has gone down. In other words, the counter-carry signals are not changed or updated until the present $\phi_{COUNT}$ signal has gone low, thereby preventing further changes to occur in the counter cell outputs.

Figure 5:
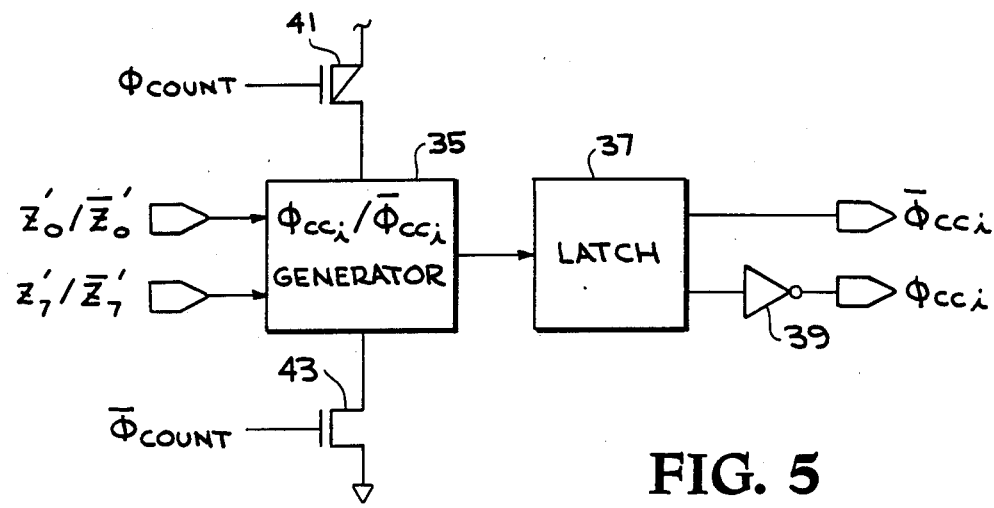
FIG. 5 is a block diagram of a counter-carry generator for use with the block diagram of FIG. 2.

A block diagram for implementing this solution of the present invention is shown in FIG. 5 of the drawings. A counter-carry signal $\phi_{CCi}/\overline{\phi}_{CCi}$ generator 35 receives the outputs $Z'_0/\overline{Z}'_0$, $Z'_1/\overline{Z}'_1$, . . . $Z'_7/\overline{Z}'_7$ from the counter cells $B_0$, $B_1$, . . . $B_7$. The outputs of the counter-carry generator 35 are connected to a latch 37. A first output of the latch 37 provides the complement counter-carry signal $\overline{\phi}_{CCi}$ (i=0, 1, . . . 7). A second output of the latch 37 provides the true counter carry signal $\phi_{CCi}$ via an inverter 39. A P-channel MOS transistor 41 has its source connected to a supply potential VCC, its drain connected to the generator 35 and its gate connected to the $\phi_{COUNT}$ signal. A N-channel MOS transistor 43 has its drain connected to the generator 35, its source connected to a ground potential and its gate connected to the complement of the $\phi_{COUNT}$ signal, $\overline{\phi}_{COUNT}$. It is a feature of the present invention that the generator 35 can be selectively enabled or disabled depending upon the state of $\phi_{COUNT}$ and $\overline{\phi}_{COUNT}$ applied to the gates of the transistors 41 and 43. When one set of these complementary logic signals exists (i.e. $\phi_{COUNT}$=low and $\overline{\phi}_{COUNT}$=high), the generator 35 is enabled. On the other hand, when another set of these logic signals exists (i.e. $\phi=_{COUNT}$ high and $\overline{\phi}_{COUNT}$=low), the generator 35 is disabled.

In operation, when $\phi_{COUNT}$ of the present cycle is still in the low state, the outputs $Z'_i/\overline{Z}'_i$ (i=0, 1, . . . 7) from the previous cycle control the generator 35 and are coupled to the latch 37 which contains the counter-carry signals $\phi_{CCi}/\overline{\phi}_{CCi}$. This is because both of the transistors 41 and 43 are turned on. When the $\phi_{COUNT}$ of the present cycle goes high, the transistors 41 and 43 are turned off which isolates the outputs of the generator 35 from the latch 37. As a result, the counter-carry signals $\phi_{CCi}/\overline{\phi}_{CCi}$ of the present cycle are latched and are not changed. While the $\phi_{CCi}/\overline{\phi}_{CCi}$ of the present cycle will cause the appropriate counter cells to flip and the new outputs $Z'_i/\overline{Z}'_i$ will be sent to the generator 35, the outputs of the generator will not yet be delivered to the latch. When $\phi_{COUNT}$ returns to the low state, the transistors 41 and 43 will be turned on again. This causes the outputs of the generator 35 to be sent to the latch 37 so as to update $\phi_{CCi}/\overline{\phi}_{CCi}$ for the next cycle. As a result, while $\phi_{COUNT}$ is overlapped with $\phi_{CCi}/\overline{\phi}_{CCi}$, they will not be updated until the $\phi_{COUNT}$ of the present cycle has gone low. Then, it will be updated and ready for the next cycle of $\phi_{COUNT}$. Accordingly, the outputs, $Z'_i/\overline{Z}'_i$, are prevented from changing more than once during a cycle of $\phi_{COUNT}$, thereby avoiding a "counter error".

Figure 6:
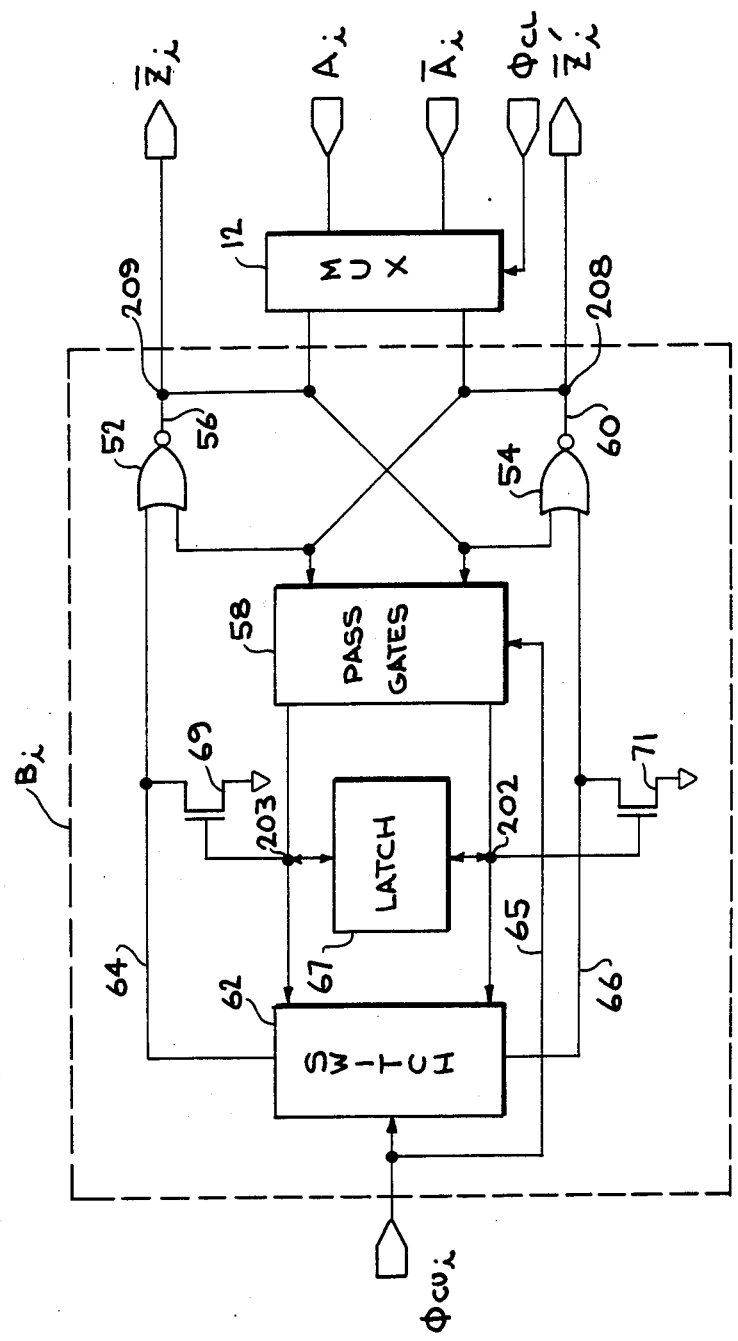
FIG. 6 is a block diagram of one counter cell of the 8-bit counter of FIG. 2.

FIG. 6 is a block diagram of one counter cell $B_i$ (ith bit where i=0, 1, 0 . . . 7) of the 8-bit binary counter 34a (shown in FIG. 2). The multiplexor 12 receives the start addresses $A_i$ and $\overline{A}_i$ from the load address bus 13 (FIG. 1) for loading or presetting the respective true and complement output $Z'_i$ and $\overline{Z}'_i$ of the counter cell $B_i$. The multiplexor 12 is controlled by a "counter-load" signal $\phi_{CL}$ from the block 30 which is supplied by the user for initiating the loading of a start address. The input signal to the counter cell $B_i$ is from the counter-update signal $\phi_{CUi}$ which causes the true and complement $Z'_i/\overline{Z}'_i$ to switch or to change states.

The counter cell $B_i$ includes a cross-coupled NOR-latch which is formed of a first NOR gate 52 and a second NOR gate 54. The output of the NOR gate 52 on line 56 (true address $Z'_i$) is fed to a first input of the NOR gate 54 and also to the pass gate block 58. The output of the NOR gate 54 on line 60 (complement address $\overline{Z}'_i$) is fed to a first input of the NOR gate 52 and also to the pass gate block 58. A switch block 62 is coupled to the outputs of the pass gate block 58. The pass gate is controlled by $\phi_{CUi}$ which are at the outputs of $G_0$, $G_1$, . . . $G_7$ (FIG. 2) via line 65. The switch 62 also receives $\phi_{CUi}$ as an input signal and determines whether the $\phi_{CUi}$ is fed via line 64 to a second input of the NOR gate 52 or via lines 66 to a second input of the NOR gate 54. A latch 67 is coupled to the outputs of the pass gate block 58 and has its output fed to the switch block 62 and to a pair of pull-down devices 69 and 71, which are coupled to lines 64 and 66, respectively.

Figure 7:
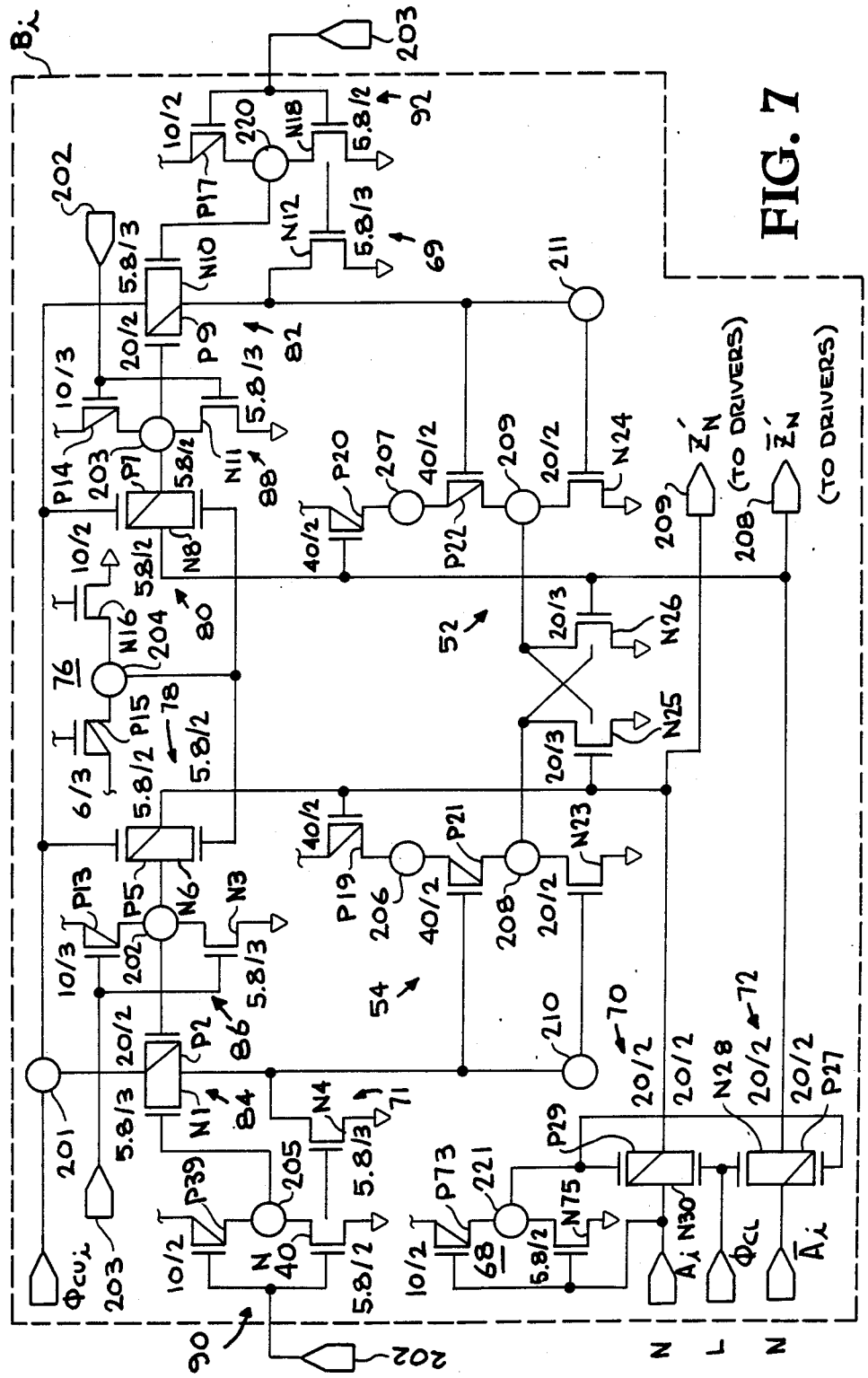
FIG. 7 is a schematic circuit diagram of the counter cell of FIG. 6.

A detailed schematic circuit diagram of the various blocks in FIG. 6 are depicted in FIG. 7. The multiplexor 12 is formed of an inverter 68, a pass gate 70 and a pass gate 72. The inverter 68 consists of transistors P73 and N75. The pass gate 70 consists of transistors P29 and N30. The pass gate 72 consists of transistors P27 and N28. The NOR gate 52 is formed of transistors P20, P22, N24 and N26. The NOR gate 54 is formed of transistors P19, P21, N23, and N25. The pass gate block 58 includes an inverter 76, a pass gate 78 and a pass gate 80. The inverter 76 is comprised of transistors P15 and N16. The pass gate 78 is comprised of transistors P5 and N6. The pass gate 80 is comprised of transistors P7 and N8. The switch block 62 is made up of a pass gate 82 consisting of transistors P9 and N10 and a pass gate 84 consisting of transistors P2 and N1. The latch block 67 includes a cross-coupled inverter latch which consists of first and second inverters 86 and 88. The first inverter 86 is formed of transistors P13 and N3, and the second inverter 88 is formed of transistors P14 and N11. The latch block 67 further includes a third inverter 90 made up of transistors P39 and N40 and a fourth inverter 92 made up of transistors P17 and N18. The pull down device 69 comprises a transistor N12. The pull down device 71 comprises a transistor N4. For convenience, it will be noted that the P-channel MOS transistors have been identified by the letter P followed by a particular reference numeral, and the N-channel MOS transistors have been identified by the letter N followed by a particular reference numeral.

The operation of the circuit of FIGS. 6 and 7 will now be described. As will be recalled, the $\phi_{COUNT}$ is only delivered to a particular counter cell via $\phi_{CUi}$ whose outputs are required to be flipped. Thus, it is assumed that the counter cell $B_i$ of FIGS. 6 and 7 is to be flipped. Further, it will be assumed that the counter-load pulse $\phi_{CL}$ has been applied to the multiplexor 12 for the loading of the start address of the counter cell such that the true address $Z_i$ is "1" and the complement address $\overline{Z}_i$ is "0". With the counter-update signal $\phi_{CUi}$ in the low state, the pass gates 78 and 80 are both open or turned on. Therefore, the outputs $Z'_i/\overline{Z}'_i$ are allowed to pass through so as to control the switch block 62. As a result, the pass gate 82 of the switch block 62 is open which permits $\phi_{CUi}$ to be applied to the gates of the transistors P22 and N24 of the NOR gate 52. At the same time, the pass gate 84 of the switch 62 is closed or turned off which prohibits $\phi_{CUi}$ from being applied to the gates of the transistors P21 and N23 of the NOR gate 54. Since the transistor N24 is off and the transistors P20, P22 are on, the output $Z'_i$ at the drain of the transistor N26 is held high or "1". With the counter $Z'_i$ being high, this turns on the transistor N25 and turns off the transistor P19 so that the output $\overline{Z}'_i$ at its drain is held low or "0". Further, the output of the inverter 88 of the latch block 67 is held low or "0" and the output of the inverter 86 of the latch block 67 is held high or "1". Since the output of the inverter 86 is connected to the gate of the pull-down transistor N4 it will cause the same to be turned on and cause transistor P21 to turn on and transistor N23 to turn off.

Now, when the $\phi_{CUi}$ is switched to a high state, the pass gates 78 and 80 are closed or turned off which isolates the outputs $Z'_i/\overline{Z}'_i$ from the switch 62. However, the latch 67 will maintain the switch in the same condition. In other words, the pass gate 82 of the switch will remain open and the pass gate 84 of the switch will remain closed. As a result, the transistor N24 will be turned on which causes its output $Z'_i$ to change from "1" to "0" as was desired. Since the output $Z'_i$ is applied to the gates of the transistor P19 and N25, this causes transistor N25 to turn off and transistor P19 to turn on. Since the transistors P19 and P21 are now both turned on, the drain of transistor N25 or $\overline{Z}'_i$ is pulled high to the "1" state. Therefore, the counter cell has been flipped.

If it were not for the pass gate block 58, the flipped or new outputs $Z'_i/\overline{Z}'_i$ would again be applied to the switch block 62. Assuming that the new outputs are changed before the termination of the counter-update signal $\phi_{CUi}$, the condition of the switch block 62 would also change. Consequently, there would then be a further change in the outputs $Z'_i/\overline{Z}'_i$. As a result, these outputs would oscillate between "0" and "1" for the duration of the counter-update pulse signal $\phi_{CUi}$. Further, at the end of the counter-update signal $\phi_{CUi}$ the output states would be indeterminate. This phenomenon leads to "counter error". In this invention, the pass gates 78 and 80 of the pass gate block 58 are closed when the counter-update signal $\phi_{CUi}$ is high and are opened when the counter-update signal $\phi_{CUi}$ is low. Thus, only after the counter-update signal has returned to a low condition will the new outputs $Z'_i/\overline{Z}'_i$ be allowed to control the switch block 62 to be ready for the next cycle of the counter-update signal $\phi_{CUi}$. Therefore, counter error has been eliminated. In this example, the new output $Z'_i$ is "0" and the new output $\overline{Z}'_i$ is "1".

Figure 8:
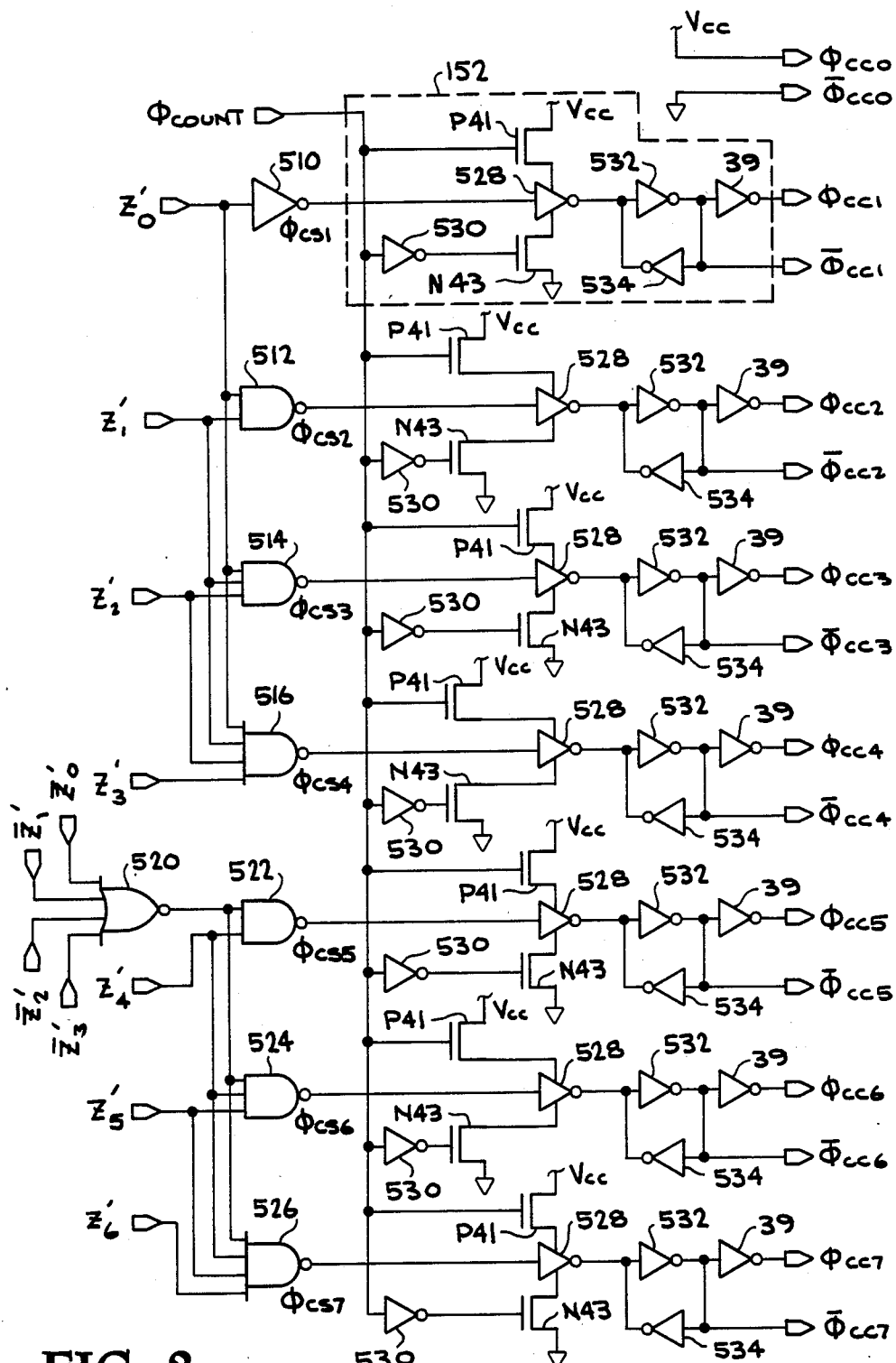
FIG. 8 is a logic block diagram of the counter-carry generator of FIG. 5.

In FIG. 8, a logic diagram is depicted for the block diagram of FIG. 5 for generating the counter-carry signals $\phi_{CCi}/\overline{\phi}_{CCi}$ (i=0, 1, ... 7). The $\phi_{CCi}/\overline{\phi}_{CCi}$ generator 35 of FIG. 5 is comprised of inverter 510; NAND gates 512, 514, 516; NOR gate 520; and NAND gates 522, 524, and 526 for generating the logic signals $\phi_{CCi}/\overline{\phi}_{CCi}$ (i=1, 2 ... 7). The generator 35 receives at its input the counter cell outputs $Z'_0$, $Z'_1$, $Z'_2$, $Z'_3$, $\overline{Z}'_0$, $\overline{Z}'_1$, $\overline{Z}'_2$, $\overline{Z}'_3$, $Z'_4$, $Z'_5$ and $Z'_6$. The counter select signals $\phi\overline{CS}_1$, $\phi\overline{CS}_2$ ... $\phi\overline{CS}_7$ are applied to the respective inverters 528. The $\phi_{COUNT}$ signal is applied to each gate of the plurality of P-channel transistors P41. The sources of the transistors P41 are tied to the supply potential VCC, and the drains of the transistors P41 are connected to the respective inverters 528. $\phi_{COUNT}$ is also fed to respective inverters 530 for driving the respective gates of the plurality of N-channel transistors N43. The drains of the transistors N43 are connected to the respective inverters 528, and the sources of the transistors N43 are connected to ground. The output of the inverters 528 define the outputs of the generator 35 of FIG. 5.

The latch block 37 of FIG. 5 is formed of a plurality of cross-coupled inverters 532 and 534, respectively. Thus, the output of respective inverters 532 provide the complement counter-carry signals $\overline{\phi}_{CCi}$. These $\overline{\phi}_{CCi}$ signals are coupled to the plurality of inverters 39 and their outputs provide the true counter-carry signals $\phi_{CCi}$. These are the counter-carry signals which are applied to the respective pass gates $G_1 \ldots G_7$ (FIG. 2). Since the pass gate $G_0$ is to be turned on all the time, the counter-carry signal $\phi_{CC0}$ applied to the gate of the P-channel transistor $X_0$ can be generated by connecting it to a ground potential, and the counter-carry signal $\phi_{CC0}$ applied to the gate of the N-channel transistor $Y_0$ can be generated by connecting it to the supply potential VCC.

Even though the logic diagram of FIG. 8 is believed to be self-explanatory to those skilled in the art, a brief description of the operation is now believed to be in order. Assume again that the counter output is 10001111 (LSB is on the right) where the outputs $Z'_0=1$, $Z'_1=1$, $Z'_2=1$, $Z'_3=1$ and $Z'_7=1$, all others are "0". Under this condition, the outputs $Z'_0$ through $Z'_4$ should all be flipped on the next cycle of $\phi_{COUNT}$. In order for this to occur, $\overline{\phi}_{CC1}$, through $\overline{\phi}_{CC4}$ must all be low or "0". As can been seen, the counter select signals $\phi\overline{CS}1$ through $\phi\overline{CS}4$ will all be low since the outputs $Z'_0$ through $Z'_3$ are all high. As a result, the outputs of the respective inverters of block 528 will all be high. In view of this, the counter-carry signals $\overline{\phi}_{CC1}$ through $\overline{\phi}_{CC4}$ at the outputs of the respective inverters 532 will indeed be all low as required so as to cause the bits $B_1$ through $B_4$ to be flipped. As will be recalled, the bit $B_0$ will always be flipped. Further, it can be seen that the logic signals $\phi\overline{CS}5$, $\phi\overline{CS}6$ and $\phi\overline{CS}7$ are all high since the output of the NOR gate 520 is high and $Z'_4$, $Z'_5$ and $Z'_6$ are all low. As a result, the counter-carry signals $\phi_{CC5}$, $\phi_{CC6}$ and $\phi_{CC7}$ at the output of the respective inverters 532 will be high. Therefore, the bits $B_5$, $B_6$ and $B_7$ will not be flipped. It should now be apparent that the only time when all of the bits $B_0$, $B_1$, ... $B_7$ are all flipped occurs when the counter output is 11111111. When the next cycle of the $\phi_{COUNT}$ signal appears, the counter output turns to 00000000 which is referred to as the "wrap-around condition".

Figure 9:
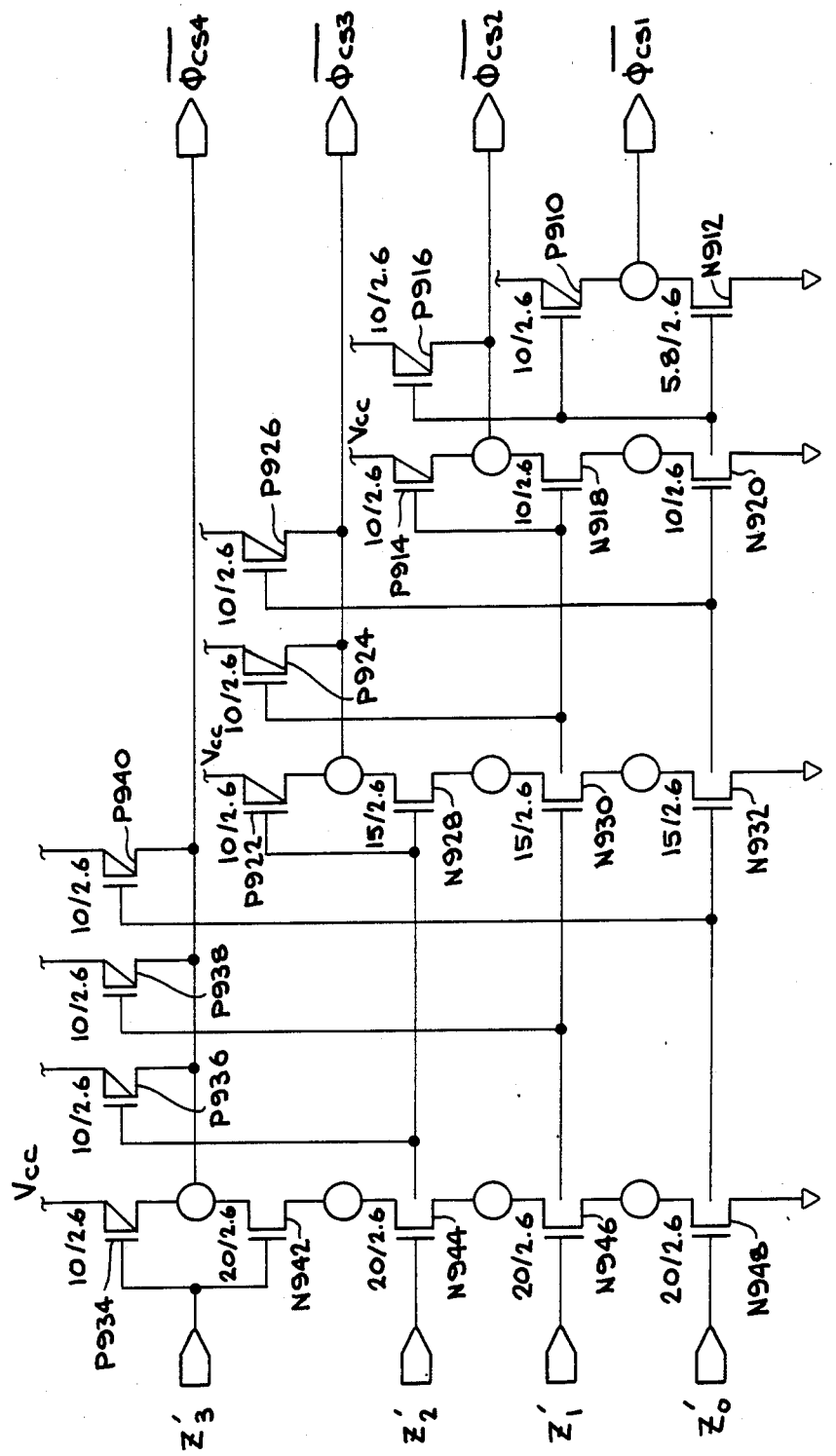
Figure 10:
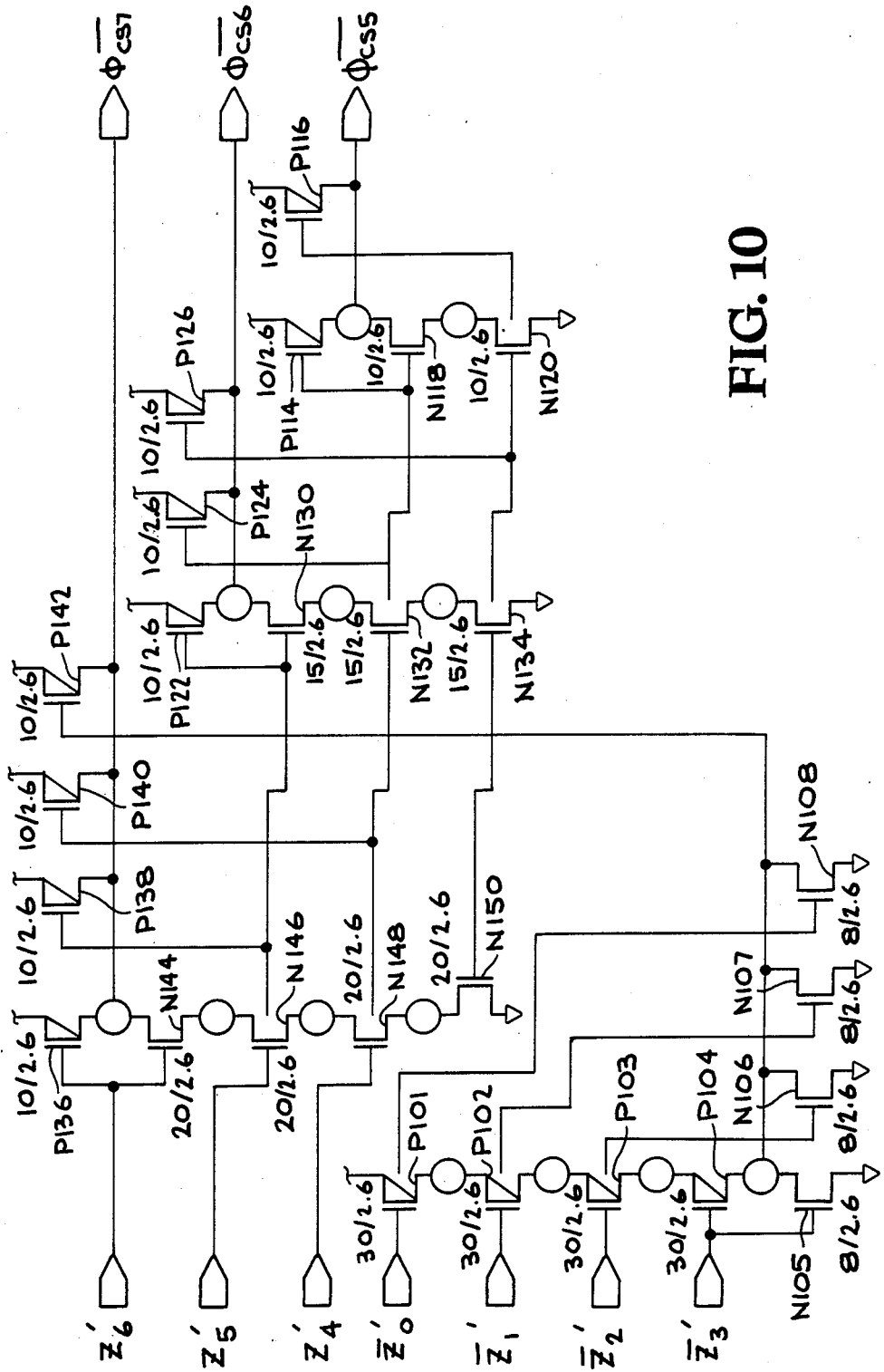

While it also should be apparent to those skilled in he art that there are various ways to form the inverter 510, NAND gates 512-516, NOR gate 520 and NAND gates 522-526 shown in the logic diagram of FIG. 8, there are, illustrated in FIGS. 9 and 10 detailed schematic circuit diagrams for implementing these logic gates by using entirely CMOS technology. In FIG. 9, the transistors P910, N912, correspond to the inverter 510; the transistors P914, P916, N918, and N920 correspond to the two-input NAND gate 512; the transistors P922, P924, P926, N928, N930, and N932 correspond to the three-input NAND gate 514; and the transistors P934, P936, P938, P940, N942, N944, N946, and N948 correspond to the four-input NAND gate 516 for generating the counter select signals $\phi_{\overline{CS}_1}$ through $\phi_{\overline{CS}_4}$ respectively. In FIG. 10, the transistors P101, P102, P103, P104, N105, N106, N107, and N108, correspond to the four-input NOR gate 520; the transistors P114, P116, N118 and N120 correspond to the two-input NAND gate 522; the transistors P122, P124, P126, N130, N132 and N134 correspond to the three-input NAND gate 524; and the transistors P136, P138, P140, P142, N144, N146, N148, and N150 correspond to the four-input NAND gate 526 for generating $\phi_{\overline{CS}_5}$, $\phi_{\overline{CS}_6}$ and $\phi_{\overline{CS}_7}$, respectively.

Figure 11:
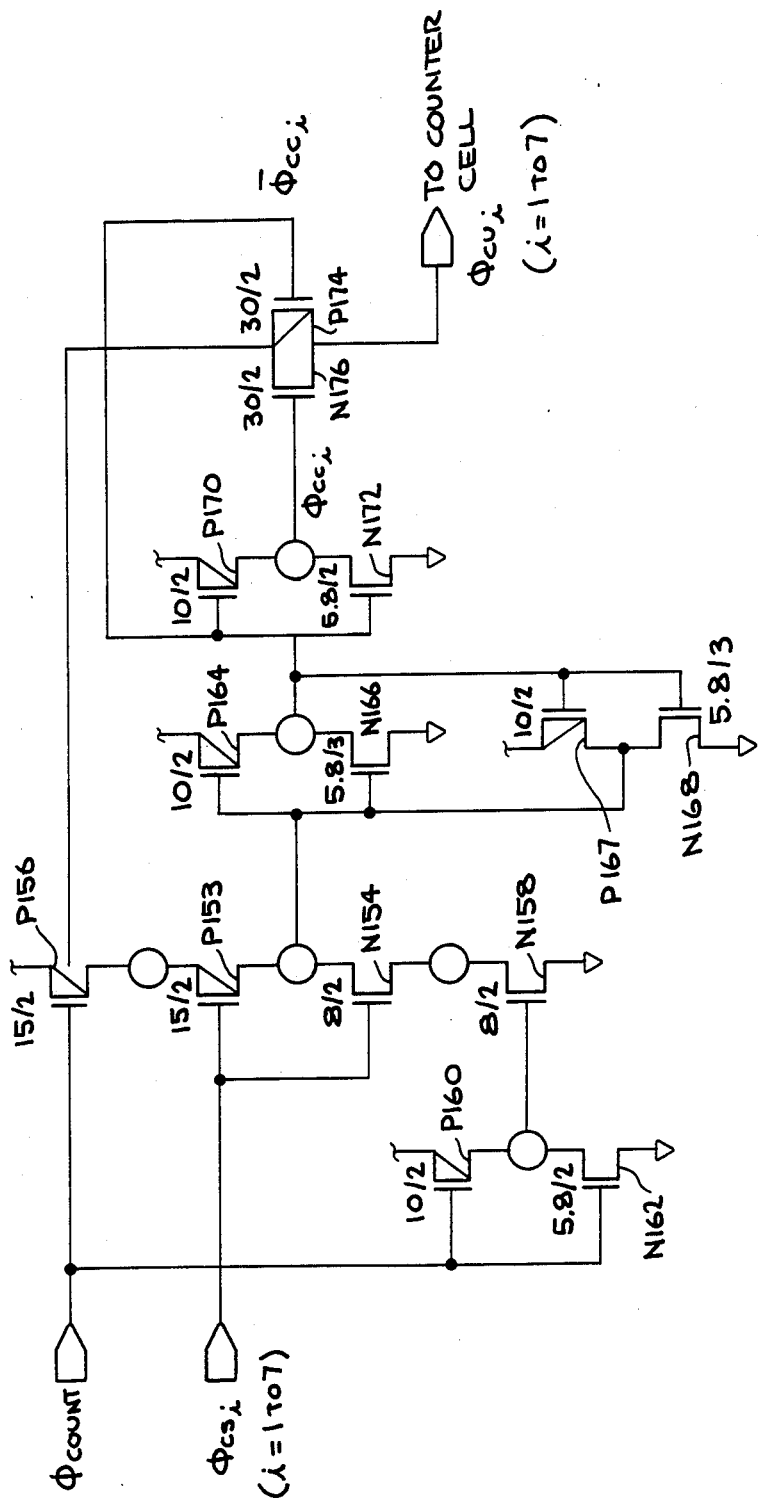

Since the circuit portion of the right of the logic signals $\phi_{\overline{CS}_i}$ (i=1, 2, ... 7) in FIG. 8 for generating the counter-carry signals, $\phi_{CC_i}/\overline{\phi_{CC_i}}$, contains seven identical circuit portions 152, it will be sufficient to explain the detailed circuit schematic of one of them, which is depicted in FIG. 11. In FIG. 11, the transistors P153 and N154 corresponds to the inverter 528; the transistor P156 corresponds to the transistor P41; the transistor N158 corresponds to the transistor N43; and the transistors P160 and N162 correspond to the inverter 530. Further, the transistors P164 and N166 correspond to the inverter 532; the transistors P167 and N168 correspond to the inverter 534; the transistors P170 and N172 correspond to the inverter 39; the transistor P174 corresonds to one of the P-channel transistors $X_1 \ldots X_7$ in the pass gates $G_1 \ldots G_7$ (FIG. 2), and the transistor N176 corresponds to one of the N-channel transistors $Y_1 \ldots Y_7$ in the pass gates $G_1 \ldots G_7$.

Figure 12:
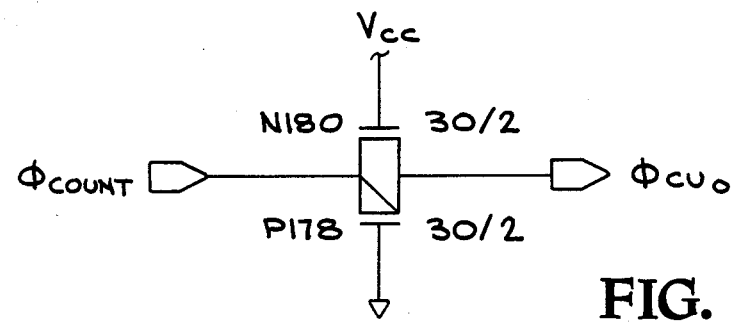
FIGS. 9, 10, 11 and 12 are schematic circuit diagrams showing circuitry suitable for use in certain blocks shown in FIG. 8.

FIG. 12 is a schematic diagram for generating the counter-update signal $\phi_{CU0}$ for the counter cell $B_0$. The transistor P178 corresponds to the P-channel transistor $X_0$ in FIG. 2 and the transistor N180 corresponds to the N-channel transistor $Y_0$ in the pass gate $G_0$. FIG. 13 shows in block diagram form a circuit for generating the $\phi_{COUNT}$ signal. As can be seen, a block 182, designated as a rising edge triggered mono-shot generator device, receives the user-supplied signal $V_{CLK}$. In response to the $V_{CLK}$, the generator 182 provides the $\phi_{COUNT}$ signal.

Figure 14:
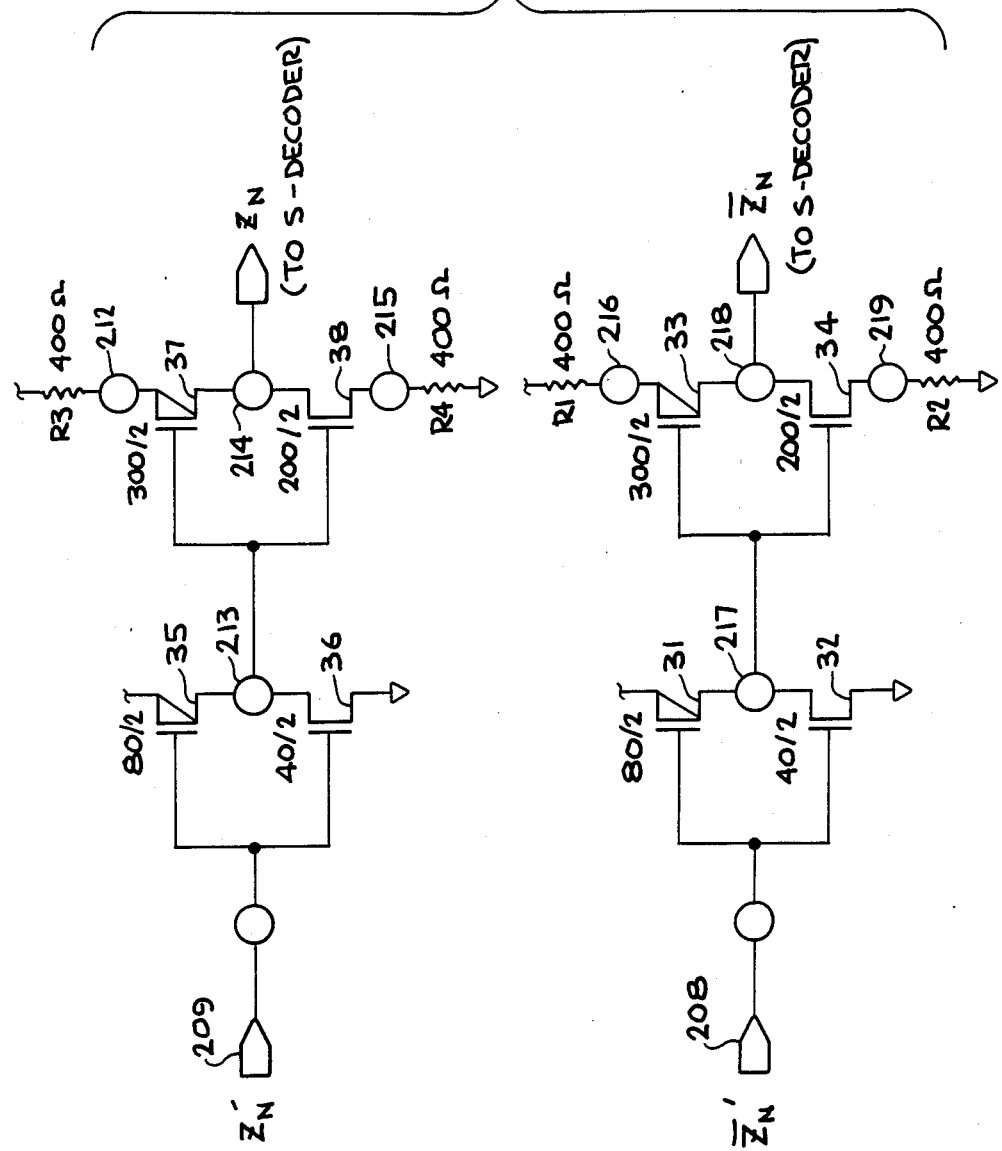
FIG. 14 is a schematic diagram illustrating circuitry for use in the address driver block of FIG. 1.

There is shown in FIG. 14 a schematic diagram for the address drivers 40 of FIG. 1. The driver for producing $\overline{Z}_N$ receives as its input the signal $\overline{Z}40_N$ and is formed of transistors P31, N32, P33, N34 and current-limiting resistors R1, R2. Similarly, the driver for producing the output $Z_N$ receives as its input the signal $Z'_N$ and is formed of transistors P35, N36, P37, N38, and the current-limiting resistors R3, R4. It should be understood that the signals $Z'_N/\overline{Z}'_N$ refer to signals which are internal to the counter 34 and form the internal address bus 16 in FIG. 1. Also, the signals $Z_N/\overline{Z}_N$ refer to the outputs of the address drivers 40 of FIG. 1 which have high current-driving capability. These signals $Z_N/\overline{Z}_N$ form the address bus 44 of FIG. 1 and supply the address to the decoder device.

The high speed binary counter of the present invention has the following advantages:

(a) it is resettable and loadable from a user-supplied address;

(b) it requires a relatively small amount of power since all of the circuitry are to be constructed entirely from CMOS transistor circuit elements;

(c) it can be initiated at any of $2^N$ starting locations (where N=bit count);

(d) it is responsive only to a single edge of the user-controlled increment signal;

(e) it has wrap-around capability;

(f) it can be easily adapted to any desired number of counter cells or bits;

(g) it is a very fast CMOS counter which has a cycle time of 35 ns with a 10 pF load; and (h) it is capable of operating over wide ranges of temperatures and power supply conditions.

From the foregoing detailed description, it can thus be seen that the present invention provides an improved high speed binary counter.

While there has been illustrated and described what is at present to be considered a preferred embodiment of the present invention, it will be understood by those skilled in the art that various changes and modifications may be made, any equivalent may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention but that the invention will include all embodiments falling within scope of the appended claims.

What is claimed is:

1. A high speed binary counter, each counter cell thereof comprising:

first logic means for storing a binary number and for generating a true address corresponding to said stored binary number;

second logic means for storing a complement of the binary number and for generating a complement address corresponding to the inverse of said stored binary number;

multiplexor means responsive to a user-supplied counter-load signal for loading said binary number and said complement of the binary number into said first and second logic means respectively;

pass gate means responsive to a counter-update signal for allowing said true and complement addresses to control a switching means when said counter-update signal is in the low state and for isolating said true and complement addresses from said switching means when said counter-update signal is in the high state;

switching means responsive to said true and complement addresses for directing said counter-update signal to either said first logic or said second logic means so as to change the state of said true and complement addresses;

latch means responsive to said pass gate means for maintaining said switch means in the same condition when said true and complement addresses are isolated from said switch means;

first pull-down means connected to an input of said first logic means for maintaining its input in the low state when said counter-update signal is directed to said second logic means; and second pull-down means connected to an input of said second logic means for maintaining its input in the low state when said counter-update signal is directed to said first logic means.

2. A high speed binary counter as claimed in claim 1, wherein said first logic means is comprised of a NOR gate.

3. A high speed binary counter as claimed in claim 1, wherein said second logic means is comprised of a NOR gate.

4. A high speed binary counter as claimed in claim 1, wherein said first and second logic means comprises a cross-coupled latch formed of a pair of NOR gates.

5. A high speed binary counter as claimed in claim 1, wherein said first pull-down means comprises a N-channel MOS transistor.

6. A high speed binary counter as claimed in claim 1, wherein said second pull-down means comprises a N-channel MOS transistor.

7. A high speed binary counter as claimed in claim 1, further comprising a counter-update gating device interconnected between a counter pulse signal and each counter cell, the counter-update gating device includes:
   a P-channel MOS transistor and a N-channel MOS transistor having their drains connected together and their sources connected together;
   the counter pulse signal being connected to said common sources of said P-channel and N-channel transistors; p1 the gate of said P-channel transistor being connected to a complement counter-carry signal and the gate of said N-channel transistor being connected to a true counter-carry signal for enabling of said gating device when said complement counter-carry signal is in the low state;
   said counter-update signal being generated at the common drains of said P-channel and N-channel transistors when said gating device is enabled; and
   counter-carry logic means responsive to all of said counter cell true addresses which are lower in order for geneating the true and complement counter-carry signals when all of said lower order true addresses are in the high state.

8. A high speed binary counter as claimed in claim 7, wherein said counter-carry logic means includes counter-carry generator means having inputs and outputs, a P-channel transistor and a N-channel transistor coupled to said counter-carry generator means, latch means coupled to the output of said generator means, a first output of said latch defining said complement countery-carry signal, and an inverter coupled to a second output of said latch means for generating at its output said true counter-carry signal.

9. A high speed binary counter as claimed in claim 8, wherein said counter pulse signal is coupled to said P-channel and N-channel transistors for disabling the output of said counter-carry generator means from said latch means when said counter pulse signal is in the high state and for enabling the output of said counter-carry generator means to pass through to said latch means when said counter pulse signal is in the low state so that the true and complement counter-carry signals for the present cycle of said counter pulse signal are prohibited from being updated until after the present said counter pulse signal has gone to a low state, thereby preventing counter error.

10. A high speed binary counter comprising:
   a counter pulse signal;
   a plurality of counter cells;
   a plurality of counter-update gating devices, each gating device being interconnected between the counter pulse signal and each of the counter cells;
   each counter-update gating devide including a P-channel MOS transistor and a N-channel MOS transistor having their drains connected together and their sources connected together;
   the counter pulse signal being connected to said common sources of said P-channel and N-channel transistors;
   the gate of said P-channel transistor being connected to a complement counter-carry signal and the gate of said N-channel transistor being connected to a true counter-carry signal for enabling of said gating device only when said complement counter-carry signal is in the low state;
   a carry-update signal generated at the common drains of said P-channel and N-channel transistors when said gating device is enabled; and
   counter-carry logic means responsive to all outputs of said counter cells which are lower in order for generating the true and complement counter-carry signals when all of said lower order counter cell outputs are in the high state.

11. A high speed binary counter comprising: p1 (a) a plurality of counter cells, each counter cell including;
   first logic means for storing a binary number and for generating a true address corresponding to said stored binary number;
   second logic means for storing a complement of the binary number and for generating a complement address corresponding to the inverse of said stored binary number;
   multiplexor means responsive to a user-supplied counter-load signal for loading said binary number and said complement of the binary number into said first and second logic means respectively;
   pass gate means responsive to a counter-update signal for allowing said true and complement addresses to control a switching means when said counter-update signal is in the low state and for isolating said true and complement addresses from said switching means when said counter-update signal is in the high state;
   switching means responsive to said true and complement addresses for directing said counter-update signal to either said first logic means or said second logic means so as to change the state of said true and complement addresses;
   latch means responsive to said pass gate means for maintaining said switch means in the same condition when said true and complement addresses are isolated from said switching means;
   first pull-down means connected to an input of said first logic means for maintaining its input in the low state when said counter-update signal is directed to said second logic means; and
   second pull-down means connected to an input of said second logic means for maintaining its input in the low state when said counter-update signal is direced to said first logic means;

(b) a counter pulse signal; and p1 (c) a plurality of counter-update gating devices, each gating devide including;

a P-channel MOS transistor and a N-channel MOS transistor having their drains connected together and their sources connected together;

the counter pulse signa being connected to said common sources of said P-channel and N-channel transistors;

the gate of said P-channel transistor being connected to a complement counter-carry signal and the gate of said N-channel transistor being connected to a true counter-carry signal for enabling of said gating device only when said complement counter-carry signal is in the low state;

said counter-update signal being generated at the common drains of said P-channel and N-channel transistors when said gating device is enabled; and counter-carry logic means responsive to all of said counter cell true addresses which are lower in order for generating the true and complement counter-carry signals when all of said lower order addresses are in the high state.

12. A high speed binary counter as claimed in claim 11, wherein said first logic means is comprised of a NOR gate.

13. A high speed binary counter as claimed in claim 11, wherein said second logic means is comprised of a NOR gate.

14. A high speed binary counter as claimed in claim 11, wherein said first and second logic means comprises a cross-coupled latch formed of a pair of NOR gates.

15. A high speed binary counter as claimed in claim 11, wherein said first pull-down means comprises a N-channel MOS transistor.

16. A high speed binary counter as claimed in claim 11, wherein said second pull-down means comprises a N-channel MOS transistor.

17. A high speed binary counter as claimed in claim 11, wherein said counter-carry logic means includes counter-carry generator means having inputs and outputs, a P-channel transistor and a N-channel transistor coupled to said counter-carry generator means, latch means coupled to the output of said generator means, a first output of said latch defining said complement counter-carry signal, and an inverter coupled to a second output of said latch means for generating at its output said true counter-carry signal.

18. A high speed binary counter as claimed in claim 17, wherein said counter pulse signal is coupled to said P-channel and N-channel transistors for disabling the output of said counter-carry generator means from said latch means when said counter pulse signal is in the high state and for enabling the output of said counter-carry generator means to pass through to said latch means when said counter pulse signal is in the low state so that the true and complement counter-carry signals for the present cycle of said counter pulse signal are prohibited from being updated until after the present said counter pulse signal has gone to a low state, thereby preventing counter error.

* * * * *